(12) United States Patent
Hattori (10) Patent No.: US 7,056,779 B2
(45) Date of Patent: Jun. 6, 2006

(54) SEMICONDUCTOR POWER DEVICE (75) Inventor: Hidetaka Hattori, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 26 days.

(21) Appl. No.: 10/457,544

(22) Filed: Jun. 10, 2003

(65) Prior Publication Data
US 2003/0209781 A1 Nov. 13, 2003

Related U.S. Application Data (60) Provisional application No. 10/115,030, filed on Apr. 4, 2002, now Pat. No. 6,605,858.

(30) Foreign Application Priority Data
Apr. 5, 2001 (JP) ............... 2001-107252

(51) Int. Cl.
*H01L 21/336* (2006.01)
*H01L 21/8234* (2006.01)

(52) U.S. Cl. ............. 438/197; 438/203; 438/206; 438/211; 438/212

(58) Field of Classification Search ........... 438/459, 438/197, 203, 206, 211, 212, 217
See application file for complete search history.

(56) References Cited

U.S. PATENT DOCUMENTS

| 4,402,001 | A | * | 8/1983 | Momma et al. ............ 257/169 |
| 5,004,705 | A | * | 4/1991 | Blackstone ................ 438/455 |
| 5,173,435 | A | | 12/1992 | Harada |
| 5,506,153 | A | * | 4/1996 | Brunner et al. ............ 438/133 |
| 5,643,821 | A | * | 7/1997 | Beasom ..................... 438/355 |
| 5,714,775 | A | * | 2/1998 | Inoue et al. ............... 257/139 |
| 5,807,783 | A | * | 9/1998 | Gaul et al. ................ 438/406 |
| 6,001,678 | A | * | 12/1999 | Takahashi .................. 438/238 |
| 6,033,925 | A | * | 3/2000 | Han et al. ................... 438/30 |
| 6,380,586 | B1 | * | 4/2002 | Yoshikawa ................. 257/330 |
| 6,495,871 | B1 | * | 12/2002 | Hattori et al. ............. 257/279 |
| 6,501,128 | B1 | | 12/2002 | Otsuki |

(Continued)

FOREIGN PATENT DOCUMENTS

JP 11-40808 2/1999

OTHER PUBLICATIONS

Patent Abstract of Japan "Semiconductor Device" Kirihata Fumiaki, Publication No. 05-102485 (English Translation).*

(Continued)

*Primary Examiner*—W. David Coleman
*Assistant Examiner*—Khiem Nguyen
(74) *Attorney, Agent, or Firm*—Oblon, Spivak, McClelland, Maier & Neustadt, P.C.

(57) ABSTRACT

A p type base layer is formed in one surface region of an n type base layer. An n type emitter layer is formed in a surface region of the p type base layer. An emitter electrode is formed on the n type emitter layer and the p type base layer. A trench is formed in the n type emitter layer such that extends through the p type base layer to the n type base layer. A trench gate electrode is formed in the trench. The n type base layer has such a concentration gradient continuously changing in a thickness direction thereof that its portion in contact with the p type base layer has a lower concentration than its portion in contact with the p type collector layer, with the p type collector layer having a thickness of 1 μm or less.

20 Claims, 6 Drawing Sheets

U.S. PATENT DOCUMENTS

| | | |
|---|---|---|
| 6,570,240 B1 * | 5/2003 | Ohyanagi et al. ........... 257/575 |
| 6,570,241 B1 * | 5/2003 | Hashimoto .................. 257/592 |
| 6,605,858 B1 * | 8/2003 | Hattori ....................... 257/565 |
| 6,670,658 B1 * | 12/2003 | Hattori et al. .............. 257/279 |
| 6,683,343 B1 * | 1/2004 | Matsudai et al. ........... 257/328 |
| 2002/0137264 A1 * | 9/2002 | Kao et al. ................... 438/138 |
| 2005/0062073 A1 * | 3/2005 | Takahashi et al. .......... 257/222 |

OTHER PUBLICATIONS

Patent Abstract of Japan "Semiconductor Device and Its Manufacture", Koji et al., Publication No. 11-040808 (English Translation).*

* cited by examiner

FIG. 5A  Distance from emitter surface(μm)
(Where substrate concentration is 2e12/cm³)

FIG. 5B  Distance from emitter surface(μm)
(Where substrate concentration is 3e13/cm³)

SEMICONDUCTOR POWER DEVICE

CROSS-REFERENCE TO RELATED APPLICATIONS

This application is based upon and claims the benefit of priority from the prior Japanese Patent Application No. 2001-107252, filed Apr. 5, 2001, the entire contents of which are incorporated herein by reference.

BACKGROUND OF THE INVENTION

1. Field of the Invention

The present invention relates to a semiconductor power device and, more particularly to, an insulated gate bipolar transistor (IGBT), which is applicable to a power conversion inverter (power converter).

2. Description of the Related Art

A demand for a smaller size and a higher performance of a power device in the field of recent power electronics has brought attention toward improvements in performance such as a higher breakdown voltage, a larger current handling capability, a lower loss, a higher disruptive discharge voltage, and a higher operating speed. As such, a power IGBT is now used as a semiconductor power device that has a breakdown voltage of not less than 300V and can flow a higher current therethrough.

The power IGBT's include two well known structures: a planar type IGBT that has an insulating gate, for example, a flat MOS gate, and a trench type IGBT in which the MOS gate is buried in a trench. The trench type IGBT has the trench gate structure in which a number of trench IGBT cells in which the trench-side wall serves as a channel region are arrayed in parallel in a semiconductor substrate. Generally, the trench type IGBT is said to be more advantageous than the planar type IGBT because it can enjoy a lower channel resistance to thereby, for example, easily reduce the loss.

Figure 1:
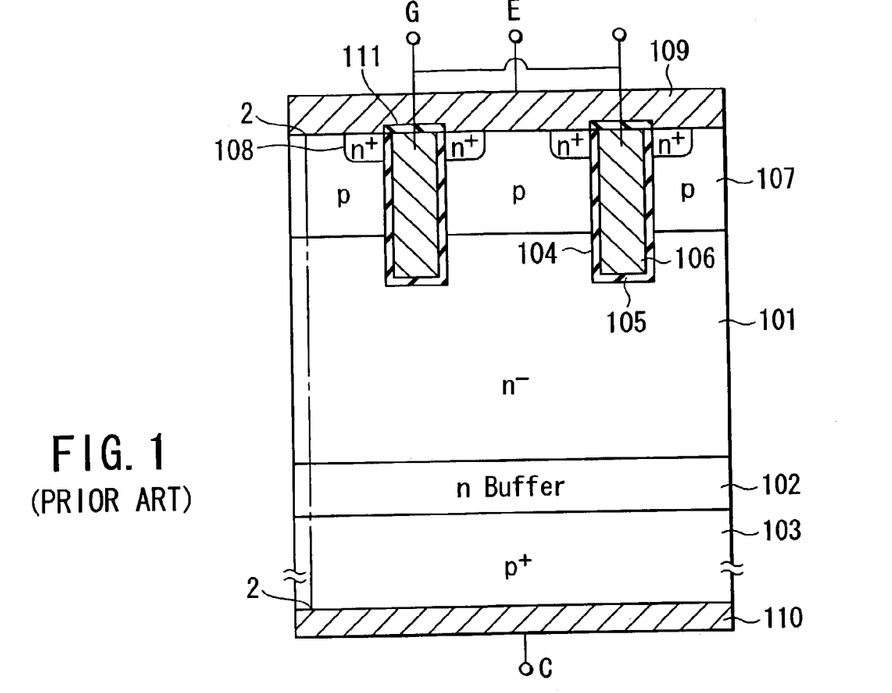
FIG. 1 is a cross-sectional view for schematically showing part of a conventional trench type IGBT.

FIG. 1 is a schematic cross-sectional view for showing part of a conventional trench type IGBT. In the IGBT, a p type base layer 107 is formed in a surface region of a high-resistance $n^-$ type base layer 101. A plurality of trenches 104 is formed in a surface region of the p type base layer 107 into the $n^-$ type base layer 101. In each of these trenches 104, a trench gate electrode 106 is buried via a gate insulating film 105. In the surface region of the p type base layer 107 which sandwiched by these trenches 104, a high impurity-concentration $n^+$ type emitter layer 108 is formed adjacent the side surface of the trench 104. It should be noted that a gate electrode 106 of each trench is drawn out to, for example, a wide gate-electrode contacting pad.

An emitter electrode 109 is provided on the surfaces of the $n^+$ type emitter layer 108 and the p type base layer 107. The emitter electrode 109 short-circuits the $n^+$ type emitter layer 108 and the p type base layer 107 to each other. Furthermore, an inter-layer insulating film 111 is provided on the trench gate electrode 106. The inter-layer insulating film 111 is interposed between the trench gate electrode 106 and the emitter electrode 109 to thereby prevent them from being short-circuited to each other.

The $n^-$ type base layer 101, p type base layer 107, $n^+$ type emitter layer 108, gate insulating film 105, and trench gate electrode 106 constitute a MOSFET. Electrons are injected from the $n^+$ type emitter layer 108 into the $n^-$ type base layer 101 through a channel region of the MOSFET. The channel region of the MOSFET is formed at such a surface region of the p type base layer 107 as to be in contact with the trench 104.

A high impurity-concentration $p^+$ type collector layer 103 is formed in the other surface region of the $n^-$ type base layer 101 via an $n^+$ type buffer layer 102. A collector electrode 110 is provided on the $p^+$ type collector layer 103.

It should be noted that it is not necessary to form the above-mentioned $n^+$ type buffer layer 102 if a desired breakdown voltage can be obtained otherwise. Furthermore, in the figure, E indicates an emitter electrode, G indicates a gate electrode, and C indicates a collector electrode.

Figure 2:
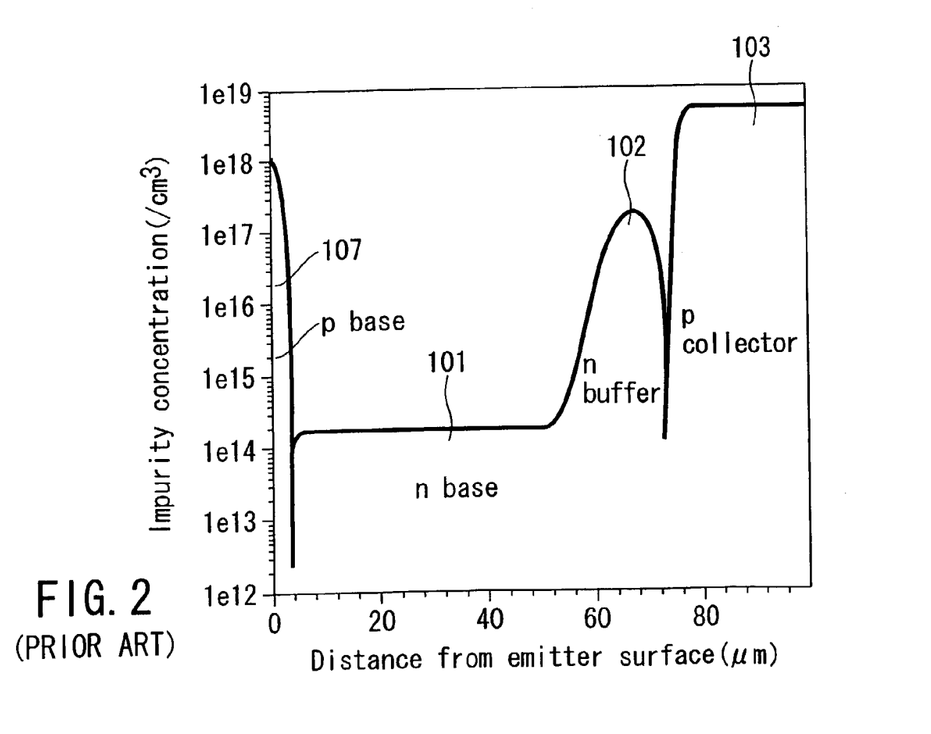
FIG. 2 is a graph for showing one example of an impurity concentration distribution on a cross section taken along line 2—2 of FIG. 1.

FIG. 2 shows one example of a distribution of the impurity concentration on a cross section taken along line 2—2 of FIG. 1. As shown in FIG. 2, an n type impurity concentration is constant in the thickness direction of the $n^-$ type base layer 101.

The IGBT having the above-mentioned structure, however, has such a problem that with a decreasing turn-OFF loss, ON-state voltage drop increases extremely in the steady state and, conversely, with the decreasing ON-state voltage drop, the turn-OFF loss increases extremely.

To solve this problem in order to obtain minimum turn-OFF loss and ON-state voltage drop, there are two methods available. (1) conducting control so as to shorten the life time (the time required for a minority carrier to be recombined) by application of an electron beam. (2) using a thin transparent collector layer.

When any of these methods is used, particularly such a punch-through type IGBT having the $n^-$ type base layer 101 and the $n^+$ type buffer layer 102, the thickness of the $n^-$ type base layer 101 must be sufficient to obtain a desired breakdown voltage in order to reduce the turn-OFF loss and the ON-state voltage drop in the steady state as much as possible. The thickness of the $n^-$ type base layer 101 is generally selected according to a relationship of about 10 μm/100V, for example.

Using the former method of life time control, a high concentration $n^+$ buffer layer is formed by epitaxial growth in a high concentration $p^+$ type substrate, in which is in turn formed a relatively high-resistance $n^-$ type base layer by epitaxial growth to obtain an $n^-/n^+/p^+$ type three-layer construction wafer in order to form thereon an IGBT having the above-mentioned structure.

By using such a life time control method, it is possible to obtain a punch-through type IGBT having a sufficiently low turn-OFF loss. However, the $n^+$ type buffer layer 102 and the $n^-$ type base layer 101 are thus formed sequentially in the p type substrate by epitaxial growth, meaning that this method increases the manufacture costs of the wafer.

By the latter method of using a thin transparent collector layer, a wafer manufactured by the floating zone (FZ) method or the Chokralski Zone (CZ) method is ground to a minimum thickness required to obtain a desired breakdown voltage, p type impurities such as boron ions are injected into a surface of the wafer to form a transparent p type collector layer with a thickness of about 1 μm, thereby form a MOS structure in the other surface of the wafer.

The method of using such a thin transparent collector layer, however, has a problem that in order to decrease the ON-state voltage drop and the turn-OFF loss as much as possible, the wafer must be very thin and so very difficult to manufacture.

According to one example of a method for manufacturing a trench type IGBT having a breakdown voltage of 1200V, for example, the p type base layer 107, the $n^+$ type emitter layer 108, the trench 104, the gate insulating film 105, the trench gate electrode 106, and the emitter electrode 109 are formed in a semiconductor substrate, respectively, then the semiconductor substrate is ground to a thickness of 120 μm, n type and p type impurity ions are implanted to form the n+ type buffer layer 102 and the p+ type collector layer 103, respectively. In this process, to activate these n type and p type impurity ions, so that they may serve as a donor and an acceptor respectively, it is necessary to conduct heat treatment at 800° C. or higher. This heat treatment, however, brings about a problem that, for example, a surface-patterned emitter electrode 109 may be melted, thus destroying the electrode pattern. Moreover, as the wafer is ground thin, as mentioned above, it warps greatly, thus making it extremely difficult to pattern the emitter electrode 109 before heat treatment.

Further, the above-mentioned methods both have a problem that the wafer may be damaged due to a change in thermal stress during the heat treatment. In addition, according to a method of activating impurity ions by, for example, annealing them by applying an energy light such as a pulse laser in place of conducting heat treatment by use of a diffusion furnace, the impurity ions can be activated only down to 1 µm or so from the wafer surface. It is therefore extremely difficult to form the n+ type buffer layer 102 which needs to be deep as much as 1 µm or more from the wafer surface, by activating and diffusing n type impurity ions. That is, a punch-through type IGBT using the above-mentioned thin semiconductor substrate suffers from a problem in that it is extremely difficult to manufacture.

It should be noted that in such a trench type IGBT having a structure shown in FIG. 1, if a spacing (cell pitch) between the trench electrodes 106 is relatively large and a contact opening width is also large as compared to a processing accuracy, the n+ type emitter layer 108 and the p type base layer 107 are short-circuited to each other via the emitter electrode 109 throughout the surface in a direction parallel to the trench 104.

As the cell pitch decreases, on the other hand, the contact opening becomes small in width, thus making it difficult to short-circuit the n+ type emitter layer 108 and the p type base layer 107 to each other via the emitter electrode 109 throughout the surface in the direction parallel to the trench 104. To solve this problem, a suggestion is made to form the n+ type emitter layer 108 of the trench type IGBT so that it may have a ladder-shaped plane pattern, that is, so that the p type base layer 107 may be exposed in a square as much as possible.

Another suggestion is made to form the n+ type emitter layer 108 so that it may have an overall mesh-shaped or offset mesh-shaped plane pattern, that is, so that a stripe-shaped exposed portion of the n+ emitter layer 108 and that of the n type base layer 107 may alternate with each other along the trench 104.

A further suggestion is made to form an emitter contact trench in the p type base layer 107 between the mutually opposing n+ type emitter layers 108 so that the emitter electrode 109 may be formed in this trench in such a manner as to come in contact with the side surface of the n+ type emitter layer 108 and the p type base layer 107.

A trench type IGBT having any one of the above-mentioned various structures also has a problem similar to that of a trench gate type IGBT having the structure shown in FIG. 1. Furthermore, the planar type IGBT has almost the same problem as the trench type IGBT.

Furthermore, such the planar type IGBT is known, as disclosed in, for example, Jpn. Pat. Appln. KOKAI No. 11-40808.This disclosed planar type IGBT has such an inclination-distributed region in which the impurity concentration is continuously changed that is formed at an n+ type buffer layer of n type drift layers, in order to improve the OFF state characteristics without increasing the overall thickness and the turn-ON resistance or the leakage current.

This planar type IGBT, however, is formed of an n−/n+/p+ three-layer structure wafer obtained by forming a high-concentration n+ type buffer layer by epitaxial growth on a p+ type high-concentration substrate and then forming thereon a relatively high-resistance n− type base layer also by epitaxial growth.

By conducting life time control on the thus obtained planar type IGBT, the turn-OFF loss can be reduced. However, the n+ type buffer layer and the n− type base layer are sequentially formed on the p type substrate by epitaxial growth, which raises the problem of increased wafer manufacturing costs. Moreover, the p type collector layer has a considerable thickness, meaning that the overall thickness cannot be reduced.

As mentioned above, the conventional punch-through type IGBT has a problem of a high manufacture cost of an employed semiconductor substrate according to the method of conducting life time control in order to obtain a minimum required turn-OFF loss and the ON-state voltage drop and also has a problem of an extremely thin semiconductor substrate and hence a difficulty in manufacture thereof by the method of using a thin transparent collector layer.

BRIEF SUMMARY OF THE INVENTION

According to one aspect of the present invention, there is provided a semiconductor power device comprises, a first base layer containing an impurity of a first conductivity type so as to have a concentration gradient which continuously changes in a thickness direction thereof, a second base layer containing an impurity of a second conductivity type formed in one surface region of the first base layer, a trench having such a depth as to reach from a surface of the second base layer through the second base layer to the first base layer, an emitter layer containing an impurity of the first conductivity type formed in the surface region of the second base layer in such a manner so as to be in contact with the trench, a gate electrode formed in the trench, a collector layer formed in the other surface of the first base layer, the collector layer contains an impurity of the second conductivity type and has a thickness of 1 µm or less, a first main electrode continuously formed on the emitter layer and the second base layer, and a second main electrode formed on the collector layer.

Furthermore, according to another aspect of the present invention, there is provided a method for manufacturing a semiconductor power device comprises, introducing an impurity of a first conductivity type into a semiconductor substrate from one surface to form a first base layer, the first base layer having a concentration gradient which continuously changes in a thickness direction thereof, introducing an impurity of a second conductivity type into the first base layer to form a second base layer, introducing an impurity of the first conductivity type into the second base layer to form an emitter layer, forming a trench in the emitter layer, the trench having a depth that reaches through the second base layer to the first base layer, forming a gate electrode in the trench, forming a conductive layer on the resultant structure, then patterning the conductive layer to form a first main electrode continuously on the second base layer and the emitter layer, removing the first base layer from the other surface to provide a desired thickness of the first base layer, introducing an impurity of the second conductivity type into the other surface of the first base layer to form a collector layer, and forming a second main electrode on an exposed surface of the collector layer.

DETAILED DESCRIPTION OF THE INVENTION

The following describes embodiments of the present invention with reference to the drawings.

FIRST EMBODIMENT

Figure 3:
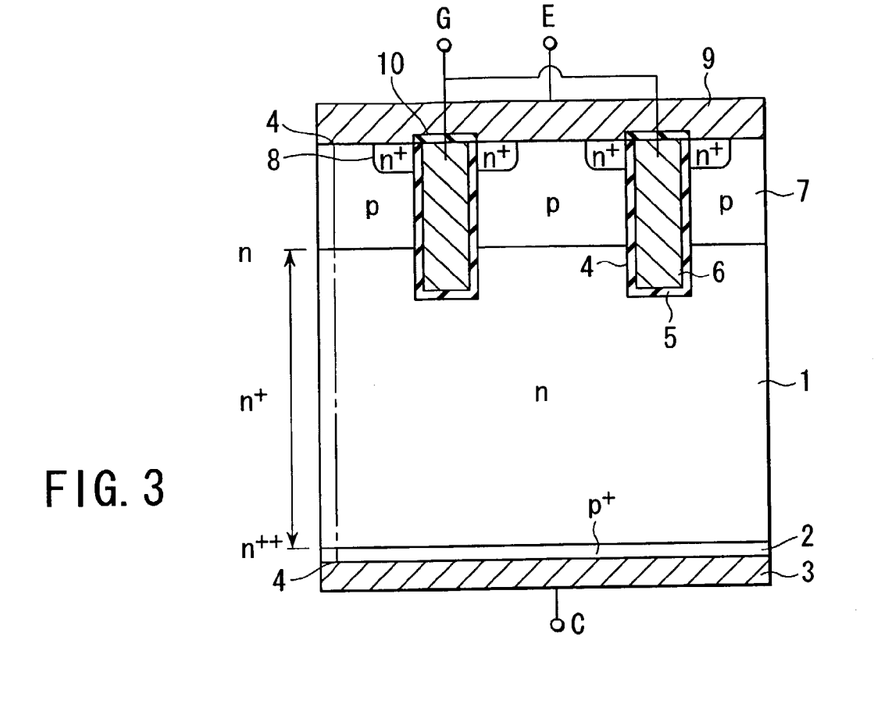
FIG. 3 is a cross-sectional view for showing the trench IGBT according to a first embodiment of the present invention.

In FIG. 3 showing a trench type IGBT according to the first embodiment, a reference numeral 1 indicates a base layer (n type base layer) having a first conductivity type (n type in this embodiment). A base layer (p type base layer) 7 having a second conductivity type (p type in this embodiment) is formed in one surface region of the n type base layer 1. A plurality of trenches 4 are formed in the p type base layer 7 having a depth that reaches from the surface of the p type base layer 7 through to the n type base layer 1. A high impurity-concentration n type emitter layer ($n^+$ type emitter layer) 8 is formed in a surface region of the p type base layer 7 sandwiched by the trenches 4, in contact with the side surface of the trench 4. Into each trench 4 is buried a trench gate electrode 6 via a gate insulating film 5.

In order to short-circuit the $n^+$ type emitter layer 8 and the p type base layer 7 without coming into contact with the trench gate 6, an emitter (E) electrode 9 made of, for example, an aluminum is provided on the $n^+$ type emitter layer 8 and p type base layer 7. An inter-layer insulating film 10 is deposited on the p type base layer 7 and trench gate electrode 6. An emitter electrode 9 is formed on the $n^+$ type emitter layer 8 and p type base layer 7, to contact with the $n^+$ type emitter layer 8 and the p type base layer 7.

Each trench gate electrode 6 is drawn out, for example, to a gate contact pad. A gate (G) electrode is provided so as to be in contact with the gate contact pad.

The n type base layer 1, p type base layer 7, $n^+$ type emitter layer 8, gate insulating film 5, and trench gate electrode 6 make up a MOSFET in which electrons are injected from the $n^+$ type emitter layer 8 into the n type base layer 1 through such a portion of a channel region formed in the surface of the p type base layer in contact with the gate insulating film 5 in the trench 4.

A p type collector layer ($p^+$ collector layer) 2 having a high impurity concentration is formed in the other surface region of the n type base layer 1. A collector (C) electrode 3 is formed on the $p^+$ type collector layer 2.

The following briefly describes the operations of the trench type IGBT shown in FIG. 3.

To turn it ON, in a state where a positive voltage is applied to the collector electrode 3 with respect to the emitter electrode 9, a positive voltage is applied to the trench gate electrode 6 with respect to the emitter electrode 9. Accordingly, a surface region in contact with the gate insulating film 5 of the p type base layer 7 is inverted into negative to thereby form an inversion layer, that is an n type channel, through which electrons are injected from the emitter electrode 9 into the n type base layer 1, thus arriving at the p type collector layer 2. In this case, the junction between the p type collector layer 2 and the n type base layer 1 is forward-biased, thus causing positive holes to be injected from the p type collector layer 2 into the n type base layer 1. Thus, both the electrons and the holes are injected into the n type base layer 1, as a result of which the n type base layer 1 encounters a conductivity fluctuation in the n type base layer 1 to thereby greatly reduce the resistance of the n type base layer 1, thus turning the device ON.

To turn it OFF, on the other hand, a negative voltage is applied to the trench gate electrode 6 with respect to the emitter electrode 9. Accordingly, the above-mentioned n type channel disappears, thus stopping electrons injection. The holes accumulated in the n type base layer 1 are partially discharged via the p type base layer 7 to the emitter electrode 9, while at the same time the other holes are recombined with electrons to be neutralized, thus turning it OFF.

Figure 4:
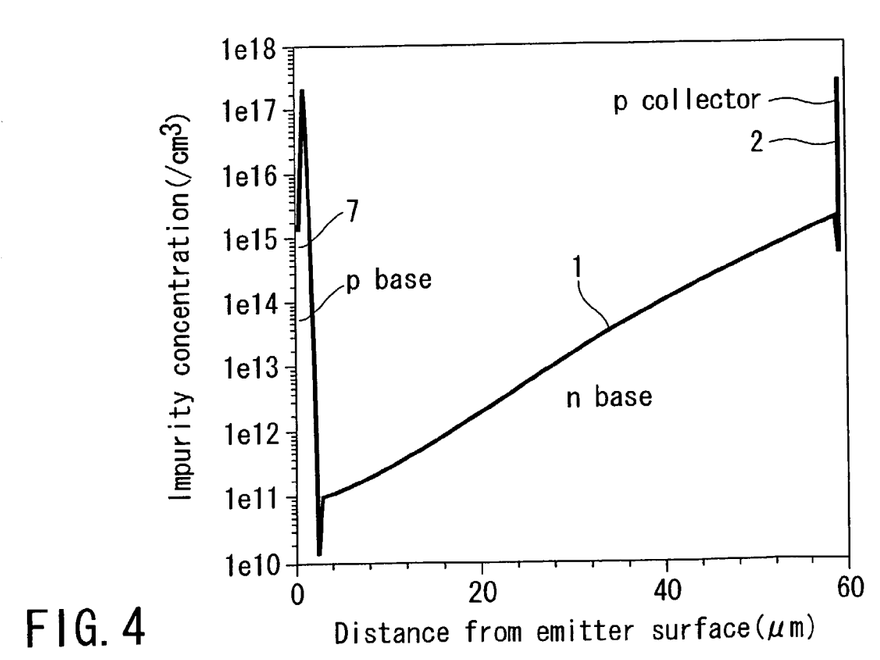
FIG. 4 is a graph for showing one example of the impurity concentration distribution on a cross section taken along line 4—4 of FIG. 3.

FIG. 4 shows one example of the impurity concentration distribution on a cross section taken along line 4—4 of FIG. 3.

The inventor found by research that, as can be seen from the figure, the thickness of the n type base layer 1 can be selected at a step of about 10 μm/100 by providing the n type base layer 1 with such an impurity concentration gradient that its collector-layer side portion may have a higher concentration than its emitter-layer side portion, setting the specific resistance of the emitter-layer side of the n type base layer 1 at 100 Ω·cm or higher, and setting the concentration peak (maximum concentration) of the collector-layer side of the n type base layer 1 at not less than 1e15/$cm^3$ but not higher than 5e16/$cm^3$.

This is based on such an assumption that an impurity has been diffused into the wafer to form the n type base layer 1 in such a manner that the impurity concentration of the n type base layer 1 may change from its emitter-layer side portion to its collector-layer side portion roughly continuously.

The conventional punch-through type IGBT has employed either a method of stopping at the $n^+$ type buffer layer 102 the spread of a depletion layer extending from the p type base layer 107 shown in FIG. 1 or a method of providing a sufficient thickness of the n⁻ type base layer 101 to thereby prevent the depletion layer from reaching the p⁺ type collector layer 103.

In contrast, the IGBT according to this embodiment utilizes such a principle that the width of the depletion layer derived from Poisson's Equation is inversely proportional to an impurity concentration gradient, to effectively inhibit the spread of the deletion layer by the impurity concentration gradient of the n type base layer 1, thus preventing the depletion layer from reaching the p⁺ type collector layer 2.

The IGBT according to the above embodiment is capable of greatly reducing the thickness of the p type collector layer 2 as compared to that of the p type collector layer 103 of the conventional punch-through type IGBT, thus greatly decreasing the overall thickness as compared to the conventional punch-through type IGBT.

The following describes specific simulation examples.

(Simulation 1)

Table 1 indicates a survey result of simulating a relationship between the specific resistance and the breakdown voltage of the emitter-side portion of the n type base layer 1 with the concentration peak of its collector side portion fixed at a certain value.

TABLE 1

| Specific resistance ($\Omega \cdot cm$) | 40k | 900 | 400 | 100 |
|---|---|---|---|---|
| Breakdown voltage (V) | 720 | 671 | 645 | 607 |

Table 1 shows that the IGBT according to the above embodiment exhibits a breakdown voltage of 600V or higher by setting the specific resistance of the emitter-side portion of the n type base layer 1 at 100 $\Omega \cdot cm$ or higher and that the thickness of the n type base layer 1 can be selected at a step of 10 μm/100V.

That is, the thickness of the n type base layer 1 of the IGBT according to the above embodiment can be selected at a step of about 10 μm/100V, as in the conventional punch-through type IGBT. Incidentally, such a conventional punch-through type IGBT containing an n⁻ type base layer having a constant specific resistance can enjoy a breakdown voltage of 600V or higher with a thickness of 60 μm, and the thickness can be selected at steps of about 10 μm/100V.

(Simulation 2)

Table 2 indicates a survey result of simulating the relationship between the concentration peak and the breakdown voltage of the collector-side portion of the n type base layer 1 with the specific resistance of its emitter-side portion fixed to 40 k$\Omega \cdot cm$ in a case where its thickness is set at 60 μm.

TABLE 2

| Concentration peak (/cm³) | 8e14 | 1e15 | 2e15 | 6e15 | 2e16 | 5e16 |
|---|---|---|---|---|---|---|
| Breakdown voltage (V) | 365 | 602 | 720 | 673 | 659 | 610 |

Table 2 shows that in the IGBT according to the above embodiment, the breakdown voltage of the collector-side portion of the n type base layer 1 gradually increases to its maximum value as its concentration peak is increased from 8e14/cm³ to 2e15/cm³. When the concentration peak further increases beyond the value of 2e15/cm³, the breakdown voltage decreases from the maximum gradually and, when it further exceeds the value of 5e16/cm³, falls down to 600V or lower.

It is thus known that by setting the concentration peak of the collector-side portion of the n type base layer 1 at 1e15/cm³ or higher but 5e16/cm³ or lower, the breakdown voltage becomes 600V or higher and that the thickness of the n type base layer 1 can be selected at steps of about 10 μm/100V.

In other words, the relationship between the impurity concentration gradient and the breakdown voltage of the collector-side portion of the n type base layer 1 indicates that the impurity concentration gradient must be 1e18/cm³ to 5e19/cm³ in order to give the breakdown voltage of 600V or higher.

Here, it has been confirmed that even when the specific resistance of the emitter-layer side portion of the n type base layer 1 is changed from the value of 40 k$\Omega \cdot cm$ in simulation 2 to values of 2 k$\Omega \cdot cm$ and 100 $\Omega \cdot cm$ respectively, the relationship between the concentration peak and the breakdown voltage of the collector-layer side portion of the n type base layer 1 stays almost the same.

It is here to be noted that the IGBT according to the above embodiment may in some cases have a region where the specific resistance of the emitter-layer side portion of the n type base layer 1 stays constant therethrough. This phenomenon occurs because when n type impurities are diffused into one surface region of the n type semiconductor substrate to form the n type base layer 1, the thickness of the formed diffusion layer of the n type impurity fluctuates due to fluctuations in the diffusion conditions such as the thickness and specific resistance of the n type semiconductor substrate and the surface concentration and diffusion time of the n type impurity.

Figure 5A:
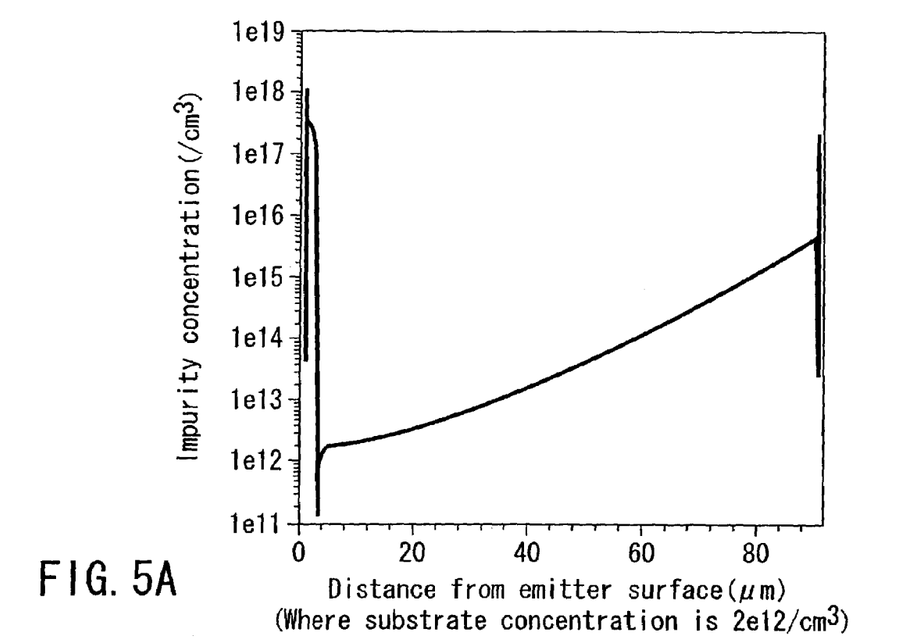
FIGS. 5A and 5B are graphs for showing one example of the impurity concentration distribution in a depth direction with respective different specific resistance values of such an emitter-layer side portion of a semiconductor substrate as to provide an n type base layer of the trench type IGBT according to the first embodiment of the present invention.
Figure 5B:
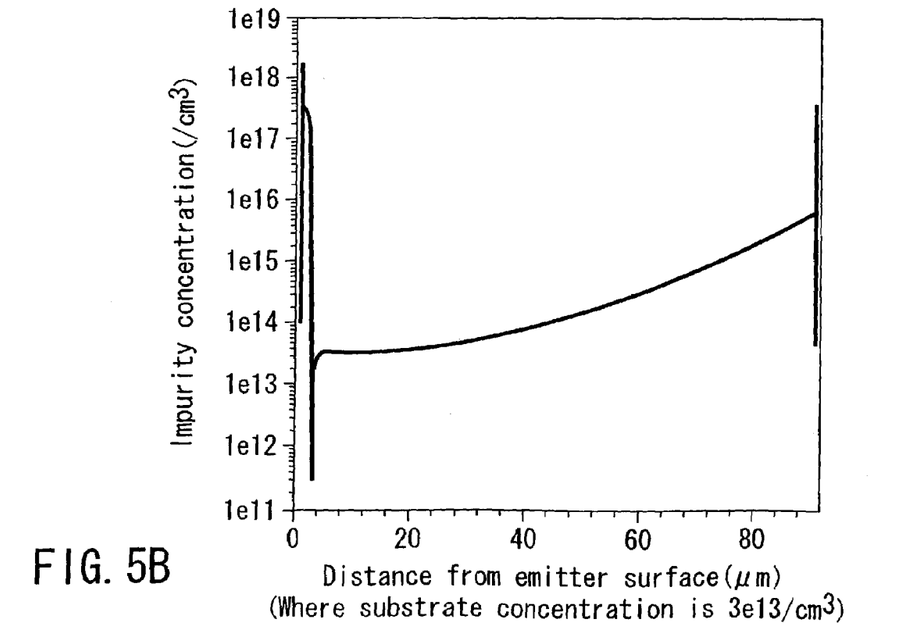

FIGS. 5A and 5B show one example of the depth-directional impurity concentration distribution in a case where the thickness of a semiconductor substrate to form thereon the n type base layer 1 of the IGBT according to the above embodiment is 90 μm and the emitter-layer side portion has a different specific resistance, each other.

These two impurity concentration distributions indicate that such a region of the emitter-layer side portion of the n type base layer 1 that has a constant specific resistance changes according to the specific resistance of the semiconductor substrate. Preferably this constant specific resistance is suppressed to 30 μm or so, taking the electric characteristics into account.

In other words, the specific resistance may stay constant within a depth of 30 μm from the surface in the emitter-layer side portion of the n type base layer 1, depending on the fluctuations in the amount of the impurity diffused into the semiconductor substrate.

As mentioned above, the IGBT according to the above embodiment utilizes the principle that the width of the depletion layer derived from the Poisson's Equation is inversely proportional to an impurity concentration gradient, to effectively inhibit the spread of the deletion layer by the impurity concentration gradient of the n type base layer 1, thus preventing the depletion layer from reaching the p⁺ type collector layer 102.

In contrast, the conventional IGBT has employed either the method of stopping, at the n+ type buffer layer 102, the spread of the depletion layer extending from the p type base layer 107 or the method of providing a sufficient thickness of the n⁻ type base layer 101 to thereby prevent the depletion layer from reaching the p+ type collector layer 103.

In the IGBT according to the above embodiment, therefore, the region where the specific resistance of the emitter-side portion of the n type base layer 1 stays constant is extremely smaller in length than the n⁻ type base layer 101 where the specific resistance stays constant in the conventional punch-through type IGBT.

The following compares the IGBT according to the above embodiment and the conventional punch-through type IGBT which have a breakdown voltage of 600V to each other in terms of ON-state voltage drop and fall time.

Figure 6:
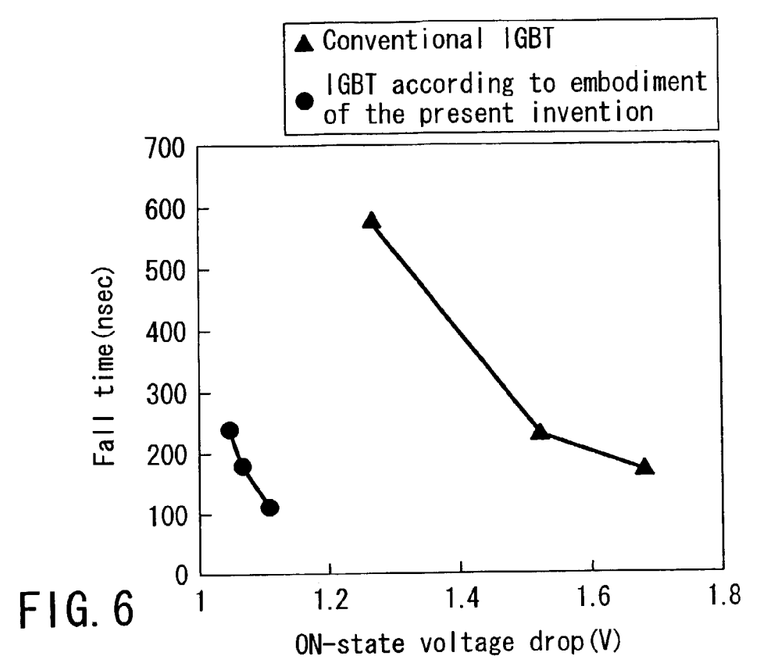
FIG. 6 is a graph for showing simulated results of an ON-state voltage drop and a fall time of the IGBT according to the first embodiment and a conventional punch-through type IGBT respectively.

FIG. 6 is a graph for showing a simulation result of the ON-state voltage drop and the fall time of the IGBT according to the above embodiment and the conventional punch-through type IGBT, in which the horizontal axis indicates a voltage and the vertical axis indicates a time.

This figures shows that the trade-off curve of the ON-state voltage drop and the fall time of the IGBT according to the above embodiment have been improved over that of the conventional IGBT.

That is, by providing the n type base layer 1 of the IGBT according to the above embodiment with a gradient in impurity concentration distribution, it is possible to minimize the turn-OFF loss and the ON-state voltage drop while at the same time sustaining a desired breakdown voltage, to thereby greatly reduce the thickness of a semiconductor substrate employed, that is to reduce it to a minimum.

The following describes a method of manufacturing an IGBT having the structure shown in FIG. 3.

Figure 7:
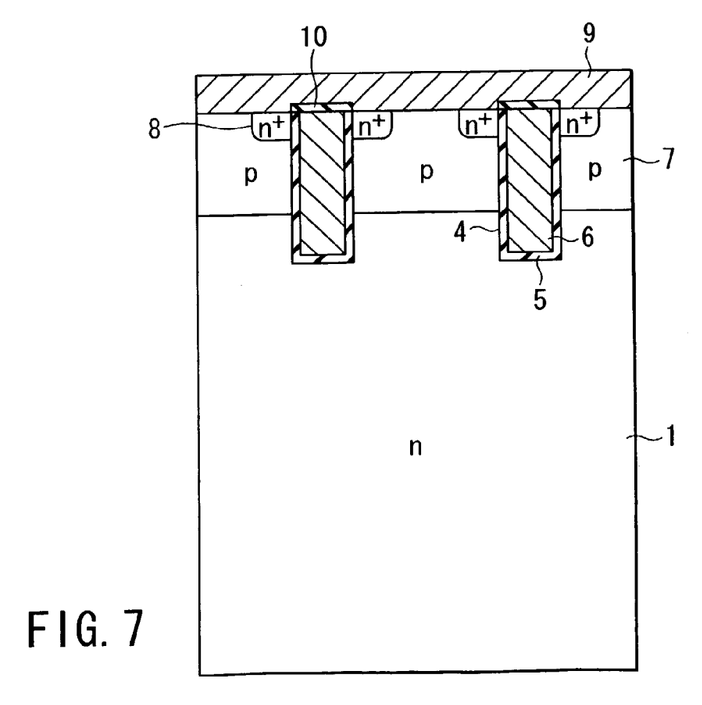
FIG. 7 is a cross-sectional view for showing a step of manufacturing the IGBT of FIG. 3.
Figure 8:
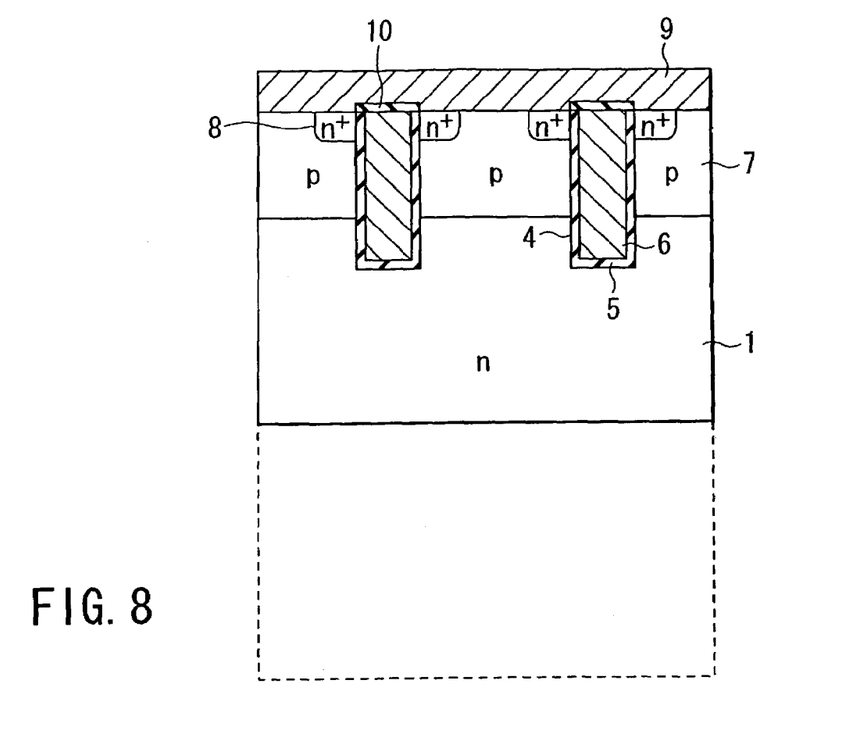
FIG. 8 is a cross-sectional view for showing a step that follows the step of FIG. 7.
Figure 9:
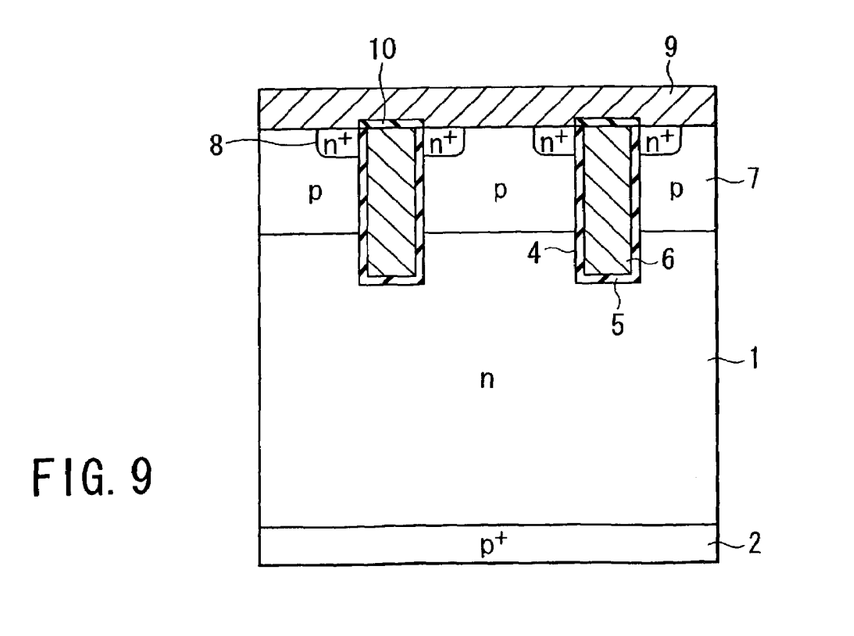
FIG. 9 is a cross-sectional view for showing a step that follows the step of FIG. 8.

FIGS. 7 to 9 are cross-sectional views for showing main steps of manufacturing the IGBT according to the embodiment shown in FIG. 3.

First, an n type semiconductor substrate is prepared for forming the n type base layer 1 thereon. In this step, an n type impurity is thermally diffused into the semiconductor substrate having a specific resistance of 100 Ω·cm to thereby provide the substrate with such an impurity concentration gradient that its one side surface may have a lower impurity concentration than the other side surface.

The n type semiconductor substrate having such an impurity concentration distribution is used as a material of the n type base layer 1 to form the p type base layer 7 by diffusion in the one surface region of the n type substrate. Then, the n⁺ type emitter layer 8 is formed by diffusion in the surface region of the p type base layer 7 in such a manner that it may have a number of stripe-shaped plane patterns. As such, an exposed portion of the p type base layer 7 also has a number of the stripe-shaped plane patterns.

Next, the trench 4, which has the striped-shaped plane pattern and also a depth that reaches to the n type base layer 1, is formed in each n⁺ type emitter layer 8. That is, this depth of thus formed trench 4 reaches from the surface of the n⁺ type emitter layer 8 through the n⁺ type emitter layer 8 and the p type base layer 7 to the n type base layer 1.

Next, the gate insulating film 5 made of $SiO_2$ etc. is formed on the inner surface of the trench 4 and the substrate. Next, the poly-silicon 6 containing phosphorus (P) is deposited by chemical vapor deposition (CVD) and then buried into the trench 4 to serve as a trench gate electrode.

Subsequently, the substrate is patterned according to a trench-gate draw-out pattern for drawing out the trench gate electrode 6 to thereby form a gate electrode-contacting wide pad and also etch back the upper surface of the poly-silicon 6 in the trench so that it may be flat with the substrate surface.

Next, the inter-layer insulating film 10 is deposited on the substrate to then form a wide contact hole for drawing out the gate electrode in the inter-layer insulating film 10 on the pad and also form a contact hole for drawing out the emitter/base both in the inter-layer insulating film 10 in the periphery of the trench opening and in the underlying gate insulating film 5 on the substrate surface.

Next, for example, an aluminum layer is formed by sputtering on the substrate to then perform predetermined patterning thereon, thus forming the emitter electrode 9 and the gate electrode.

The n type base layer 1, on the other hand, needs to be as thick as about 60 μm in order to have a breakdown voltage of, for example, 600V, so that as shown in FIG. 8, it is ground from the other surface of the n type substrate, that is, the back side surface of the substrate, to be reduced to 60 μm in thickness. In this case, supposedly the depth-directional impurity concentration distribution of the n type base layer 1 is such as shown in FIG. 4.

Next, as shown in FIG. 9, ions of a p type impurity such as boron are implanted into the ground surface of the n type base layer 1, which is then annealed by means of, for example, pulse laser application to thereby activate the p type impurity, thus forming the p type collector layer 2. Then, the collector electrode 3 is formed.

Supposedly, the p type collector layer 2 is as thick as 1 μm or less and the surface concentration of the impurity on the side of the collector electrode 3 is 1e17/cm³ or more.

Thus, a trench IGBT is manufactured which has the n type base layer 1 with a thickness of 60 μm and the p type collector layer 2 with a small thickness of 1 μm or less.

It should be noted that although it is technically possible to implement an n type semiconductor substrate having a specific resistance of 46 kΩ·cm as one example of the above-mentioned specific resistance of 100 Ω·cm or higher, it is costly.

Furthermore, it should be noted that a conventionally suggested method may be used to sufficiently short-circuit the n⁺ type emitter layer 8 and the p type base layer 7 to each other using the emitter electrode 9 even when the cell pitch is reduced in the trench type IGBT having the structure shown in FIG. 3.

That is, the IGBT may be formed so that the n⁺ type emitter layer 8 would have a ladder-shaped plane pattern, that is, so that the p type base layer 7 would be exposed in a square as many as possible. Further, the IGBT may be formed so that the n⁺ type emitter layer 8 would have an overall mesh-shaped or offset mesh-shaped plane pattern, that is, so that a stripe-shaped exposed portion of the n⁺ emitter layer 8 and that of the n type base layer 7 would alternate with each other along the trench 4.

Further, a trench contact structure may be employed whereby an emitter contact trench is formed in the p type base layer 7 between the mutually opposing n⁺ type emitter layers 8 so that the emitter electrode 9 may be formed in the trench in such a manner as to come in contact with the side surface of the n⁺ type emitter layer 8 and the p type base layer 7.

SECOND EMBODIMENT

The following describes the second embodiment of the present invention.

Unlike the first embodiment of the present invention is applied to a trench type IGBT, in the second embodiment, the present invention is applied to a planar type IGBT having a planar gate structure.

Figure 10:
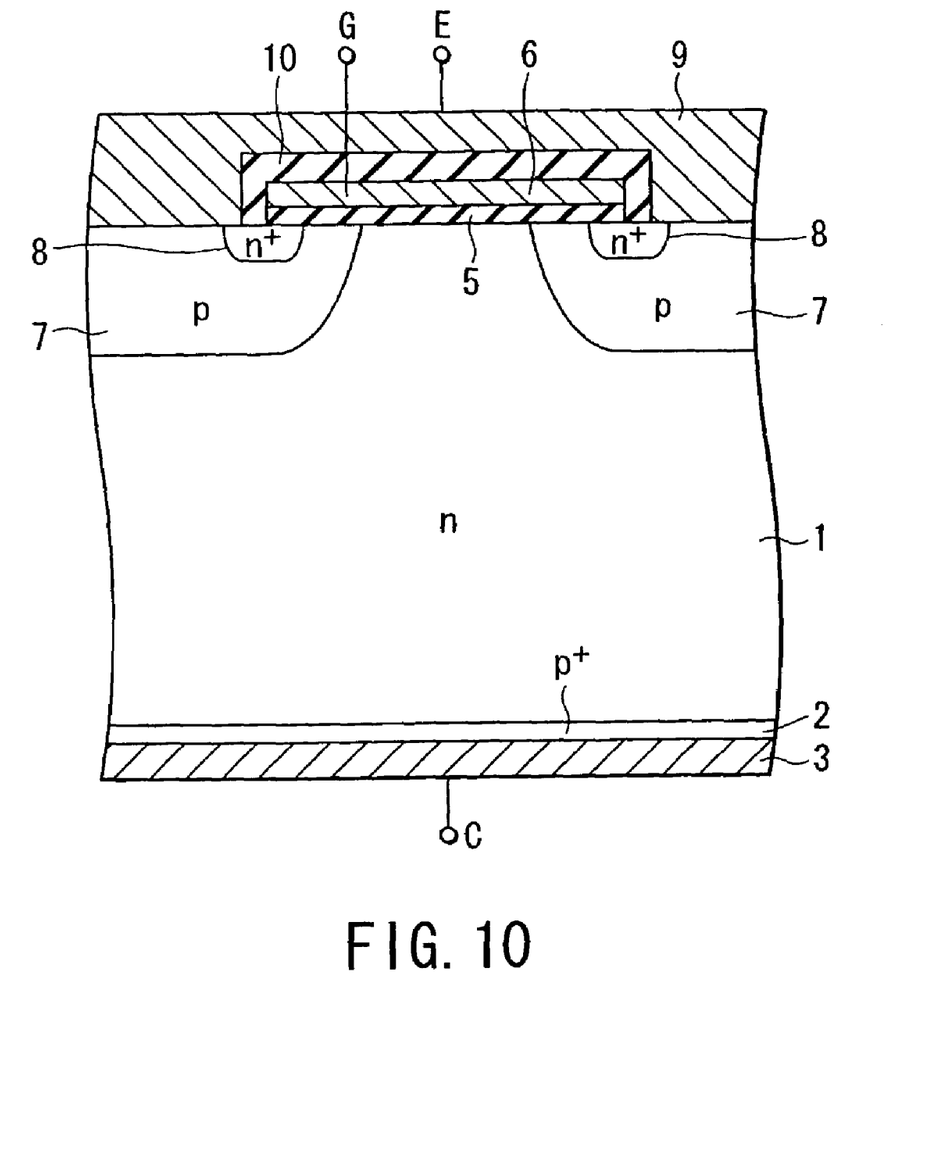
FIG. 10 is a cross-sectional view for showing a planar type IGBT according to a second embodiment of a semiconductor power device of the present invention.

The planar type IGBT has such a planar gate structure that a gate electrode is formed on a gate insulating film formed on a p type base layer with a gate structure different from that of the trench type IGBT shown in FIG. 3, the device structure of which is shown in the cross-sectional view of FIG. 10. It is here to be noted that the same components of FIG. 10 as those of FIG. 3 are indicated by the same reference symbols and their description is omitted.

Also in the IGBT of this embodiment, the n type base layer 1 is provided with an impurity concentration gradient so that its collector-layer side portion may have a higher impurity concentration than its emitter-layer side portion; specifically, the specific resistance of the emitter-layer side portion is set at 100 Ω·cm or higher and the concentration peak of the collector-layer side portion is set at $1e15/cm^3$ or higher and $5e16/cm^3$ or lower. Further, the p type collector layer 2 has a thickness of 1 μm or less and the collector electrode 3 has a surface impurity concentration of $1e17/cm^3$.

Such a planar type IGBT has also the same effects as those of the trench type IGBT shown in FIG. 3.

Although the above-mentioned embodiments have been described in a case where the collector electrode is formed directly on the collector layer, a wiring line electrically connected to the collector layer may be drawn out to a place other than the collector layer to then provide the collector electrode thereon.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor power device comprising:
   introducing an impurity of a first conductivity type into a semiconductor substrate from one surface to form a first base layer, a concentration gradient of said first base layer continuously changing at any point in a thickness direction thereof;
   introducing an impurity of a second conductivity type into said first base layer to form a second base layer;
   introducing an impurity of said first conductivity type into said second base layer to form an emitter layer;
   forming a trench in said emitter layer, said trench having a depth that reaches through said second base layer to said first base layer;
   forming a gate electrode in said trench;
   forming a conductive layer on the resultant structure, then patterning said conductive layer to form a first main electrode continuously on said second base layer and said emitter layer;
   removing said first base layer from the other surface to provide a desired thickness of said first base layer;
   introducing an impurity of said second conductivity type into said other surface of said first base layer to form a collector layer; and
   forming a second main electrode on an exposed surface of said collector layer.

2. The method according to claim 1, wherein said first base layer is formed so that a concentration of said impurity at one end of said first base layer positioned on the side of said collector layer is set in a range of $1e15/cm^3$ to $5e16/cm3$ and a concentration of said impurity at the other end of said first base layer positioned on the side of said second base layer is set $1e11/cm^3$.

3. The method according to claim 1, wherein said first base layer is formed so that a specific resistance at said one end of said first base layer positioned on the side of said collector layer is 100 Ω·cm or higher.

4. The method according to claim 1, wherein said collector layer is formed so that a surface impurity concentration of said collector layer on the side of said second main electrode is $1e17/cm3$ or higher.

5. The method according to claim 1, wherein said first base layer is formed so that the specific resistance at a depth of 30 μm or less as measured from said one end of said first base layer on the side of said second base layer is constant at 100 Ω·cm or higher.

6. The method according to claim 1, wherein said first conductivity type is an n type and said second conductivity type is a p type.

7. The method according to claim 1, wherein a concentration of the impurity of the first base layer increases continuously as distance to the collector layer decreases.

8. A method for manufacturing a semiconductor power device comprising:
   introducing an impurity of a first conductivity type into a semiconductor substrate from one surface to form a first base layer, a concentration gradient of said first base layer continuously changing at any point in a thickness direction thereof;
   introducing an impurity of a second conductivity type into said first base layer to form a second base layer;
   introducing an impurity of said first conductivity type into said second base layer to form a first semiconductor layer;
   forming a trench in said first semiconductor layer, said trench having a depth that reaches through said second base layer to said first base layer;
   forming a gate electrode in said trench;
   forming a conductive layer on the resultant structure, then patterning said conductive layer to form a first main electrode continuously on said second base layer and said first semiconductor layer;
   removing said first base layer from the other surface to provide a desired thickness of said first base layer;
   introducing an impurity of said second conductivity type into said other surface of said first base layer to form a second semiconductor layer; and
   forming a second main electrode on an exposed surface of said second semiconductor layer.

9. The method according to claim 8, wherein said first base layer is formed so that a concentration of said impurity at one end of said first base layer positioned on the side of said collector layer is set in a range of $1e15/cm^3$ to $5e16/cm^3$ and a concentration of said impurity at the other end of said first base layer positioned on the side of said second base layer is set $1e11/cm^3$.

10. The method according to claim 8, wherein said first base layer is formed so that a specific resistance at said one end of said first base layer positioned on the side of said second semiconductor layer is 100 Ω·cm or higher.

11. The method according to claim 8, wherein said second semiconductor layer is formed so that a surface impurity concentration of said second semiconductor layer on the side of said second main electrode is $1e17/cm^3$ or higher.

12. The method according to claim 8, wherein said first base layer is formed so that the specific resistance at a depth of 30 μm or less as measured from said one end of said first base layer on the side of said second base layer is constant at 100 Ω·cm or higher.

13. The method according to claim 8, wherein said first conductivity type is an n type and said second conductivity type is a p type.

14. The method according to claim 8, wherein a concentration of the impurity of the first base layer increases continuously as distance to the second semiconductor layer decreases.

15. A method for manufacturing a semiconductor power device comprising:

introducing an impurity of a first conductivity type into a semiconductor substrate from one surface to form a first base region, a concentration gradient of said first base region continuously changing at any point in a thickness direction thereof;

introducing an impurity of a second conductivity type into said first base region to form a second base region;

introducing an impurity of said first conductivity type into said second base region to form a first electrode region;

forming a trench in said first electrode region, said trench having a depth that reaches through said second base region to said first base region;

forming a gate electrode in said trench;

forming a conductive region on the resultant structure, then patterning said conductive region to form a first main electrode continuously on said second base region and said first electrode region;

removing said first base region from the other surface to provide a desired thickness of said first base region;

introducing an impurity of said second conductivity type into said other surface of said first base region to form a second electrode region; and     forming a second main electrode on an exposed surface of said second electrode region,     wherein a concentration of the impurity of the first base region increases continuously as distance to the second electrode region decreases.

16. The method according to claim 15, wherein said first base region is formed so that a concentration of said impurity at one end of said first base region positioned on the side of said second electrode region is set in a range of $1e15/cm^3$ to $5e16/cm^3$ and a concentration of said impurity at the other end of said first base region layer positioned on the side of said second base region is set $1e11/cm^3$.

17. The method according to claim 15, wherein said first base region is formed so that a specific resistance at said one end of said first base region positioned on the side of said second electrode region is 100 $\Omega$·cm or higher.

18. The method according to claim 15, wherein said second electrode region is formed so that a surface impurity concentration of said second electrode region on the side of said second main electrode is $1e17/cm^3$ or higher.

19. The method according to claim 15, wherein said first base region is formed so that the specific resistance at a depth of 30 μm or less as measured from said one end of said first base region on the side of said second base region is constant at 100 $\Omega$·cm or higher.

20. The method according to claim 15, wherein said first conductivity type is an n type and said second conductivity type is a p type.

\* \* \* \* \*